(12) United States Patent
Song et al.

(10) Patent No.: US 10,680,113 B2
(45) Date of Patent: Jun. 9, 2020

(54) THIN-FILM TRANSISTOR HAVING A FLOATING GATE BETWEEN A CONTROL GATE AND A GATE ELECTRODE, MANUFACTURING METHOD THEREOF, DISPLAY SUBSTRATE AND DISPLAY DEVICE

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/097,327

(22) PCT Filed: Mar. 30, 2018

(86) PCT No.: PCT/CN2018/081386
§ 371 (c)(1),
(2) Date: Oct. 29, 2018

(87) PCT Pub. No.: WO2018/205770
PCT Pub. Date: Nov. 15, 2018

(65) Prior Publication Data
US 2019/0288118 A1 Sep. 19, 2019

(30) Foreign Application Priority Data
May 11, 2017 (CN) .......................... 2017 1 0331388

(51) Int. Cl.
*H01L 29/66* (2006.01)
*H01L 29/76* (2006.01)
(Continued)

(52) U.S. Cl.
CPC .... *H01L 29/78645* (2013.01); *H01L 27/3244* (2013.01); *H01L 29/66742* (2013.01);
(Continued)

(58) Field of Classification Search
CPC ........... H01L 29/78645; H01L 27/3244; H01L 29/66742; H01L 29/66825; H01L 29/788; H01L 29/42324
See application file for complete search history.

(56) References Cited

U.S. PATENT DOCUMENTS

| | | | |
|---|---|---|---|
| 5,452,250 | A | 9/1995 | Riggio, Jr. |
| 5,721,444 | A | 2/1998 | Oashi et al. |

(Continued)

FOREIGN PATENT DOCUMENTS

| | | | |
|---|---|---|---|
| CN | 1130808 | A | 9/1996 |
| CN | 103594059 | A | 2/2014 |
| CN | 107068772 | A | 8/2017 |

OTHER PUBLICATIONS

International Search Report and Written Opinion dated Jul. 5, 2018 from State Intellectual Property Office of the P.R. China.

*Primary Examiner* — Alonzo Chambliss
(74) *Attorney, Agent, or Firm* — Dilworth & Barrese, LLP.; Michael J. Musella, Esq.

(57) ABSTRACT

A thin-film transistor and a manufacturing method thereof, a display substrate and a display device are disclosed. The thin-film transistor includes a control gate, a floating gate, an injection layer, an active layer, a gate electrode, and a source electrode and a drain electrode, which are provided on the base substrate, in which the source electrode and the drain electrode are opposite to each other and electrically connected to the active layer. The injection layer is provided between the floating gate and the active layer; the active layer is provided between the control gate and the gate
(Continued)

electrode; and the floating gate is provided between the control gate and the active layer.

19 Claims, 7 Drawing Sheets

(51) Int. Cl.
    *H01L 21/00*     (2006.01)
    *H01L 29/786*     (2006.01)
    *H01L 27/32*     (2006.01)
    *H01L 29/788*     (2006.01)

(52) U.S. Cl.
    CPC ...... *H01L 29/66825* (2013.01); *H01L 29/788* (2013.01); *H01L 29/78606* (2013.01)

(56) References Cited

U.S. PATENT DOCUMENTS

| | | | |
|---|---|---|---|
| 8,441,009 B2* | 5/2013 | Ieda | H01L 27/11519 |
| | | | 257/316 |
| 9,240,496 B2* | 1/2016 | Okhonin | G11C 11/404 |
| 2005/0051852 A1* | 3/2005 | Kim | H01L 27/11 |
| | | | 257/382 |
| 2015/0102349 A1* | 4/2015 | Lee | H01L 27/1255 |
| | | | 257/71 |

* cited by examiner

THIN-FILM TRANSISTOR HAVING A FLOATING GATE BETWEEN A CONTROL GATE AND A GATE ELECTRODE, MANUFACTURING METHOD THEREOF, DISPLAY SUBSTRATE AND DISPLAY DEVICE

The application claims priority to Chinese patent application No. 201710331388.7, filed on May 11, 2017, the entire disclosure of which is incorporated herein by reference as part of the present application.

TECHNICAL FIELD

Embodiments of the present disclosure relate to a thin-film transistor and a manufacturing method thereof, a display substrate and a display device.

BACKGROUND

With the development of display technologies, display devices such as liquid crystal display panels (LCD), organic electroluminescent display panels (OLED) and electronic papers are well known. Thin film transistors (TFTs) are provided in the above-mentioned display devices to control pixels to be turned on or turned off. TFTs are essential components to the pixel circuits of the liquid crystal display panels, and the organic electroluminescent display panels, and play a significant role. Therefore, many experts and scholars in the industry are attracted to continuously improve the design and preparation of TFT, so as to further improve the quality of displayed images.

SUMMARY

The embodiments of the present disclosure provide a thin-film transistor, which includes: a control gate, a floating gate, an injection layer, an active layer, a gate electrode, a source electrode and a drain electrode, which are provided on a base substrate, in which the source electrode and the drain electrode are opposite to each other and respectively electrically connected to the active layer; the injection layer is provided between the floating gate and the active layer; the active layer is provided between the control gate and the gate electrode; and the floating gate is provided between the control gate and the active layer.

In a possible implementation, the floating gate includes an injection region and an oxidation region; the injection region and the oxidation region each includes a terminal portion and an extension portion; and the extension portion of the oxidation region is provided on a surface, which faces the active layer, of the extension portion of the injection region.

In a possible implementation, a thickness of the extension portion of the oxidation region is larger than a thickness of the extension portion of the injection region.

In a possible implementation, an orthographic projection of the terminal portion of the injection region on the base substrate and an orthographic projection of a region, which is electrically contacted with the drain electrode, of the active layer on the base substrate are overlapped with each other.

In a possible implementation, an orthographic projection of the terminal portion of the oxidation region on the base substrate and an orthographic projection of a region, which is electrically contacted with the source electrode, of the active layer on the base substrate are overlapped with each other.

In a possible implementation, in the above-mentioned thin-film transistor provided by the embodiments of the present disclosure, a thickness of the injection layer is no greater than 50 nanometers.

In a possible implementation, in the above-mentioned thin-film transistor provided by the embodiments of the present disclosure, the control gate is provided above the base substrate, the floating gate is provided above the control gate, the active layer is provided above the floating gate, and the gate electrode is provided above the active layer.

In a possible implementation, the gate electrode is provided above the base substrate, the active layer is provided above the gate electrode, the floating gate is provided above the active layer, and the control gate is provided above the floating gate.

In a possible implementation, the above-mentioned thin-film transistor provided by the embodiments of the present disclosure further includes: a buffer layer provided between the control gate and the floating gate, and a gate insulation layer provided between the active layer and the gate electrode.

In a possible implementation, in the above-mentioned thin-film transistor provided by the embodiments of the present disclosure, the injection region and the oxidation region are in direct contact with each other in a direction perpendicular to the base substrate; and an orthographic projection of the floating gate on the base substrate and an orthographic projection of the control gate on the base substrate are completely overlapped with each other.

The embodiments of the present disclosure provide a display substrate, which includes the thin-film transistor provided by any one of the embodiments of the present disclosure.

In a possible implementation, in the above-mentioned display substrate provided by the embodiments of the present disclosure, the display substrate is an organic electroluminescent display panel; the organic electroluminescent display panel includes a driving transistor, a switching transistor and a control terminal; the driving transistor and the switching transistor are each implemented as the thin-film transistor; and a control gate of the driving transistor and a control gate of the switching transistor are electrically connected to a same control terminal.

The embodiments of the present disclosure provide a display device, and the display device includes the thin-film transistor provided by any one of the embodiments of the present disclosure or the display substrate provided by any one of the embodiments of the present disclosure.

The embodiments of the present disclosure provide a manufacturing method of the thin-film transistor provided by the embodiments of the present disclosure, which includes: forming a pattern includes the control gate, the floating gate, the injection layer, the active layer, the gate electrode, the source electrode and the drain electrode on the base substrate; the source electrode and the drain electrode are opposite to each other and respectively electrically connected to the active layer; the injection layer is provided between the floating gate and the active layer; the active layer is provided between the control gate and the gate electrode; and the floating gate is provided between the control gate and the active layer.

In a possible implementation, in the above-mentioned manufacturing method provided by the embodiments of the present disclosure, a thickness of the injection layer is no greater than 50 nanometers; the floating gate includes an injection region and an oxidation region; the injection region and the oxidation region each includes a terminal portion and an extension portion; the extension portion of the oxidation region is provided on a surface, which faces the active layer, of the extension portion of the injection region, and a thickness of the extension portion of the oxidation region is larger than a thickness of the extension portion of the injection region.

In a possible implementation, in the above-mentioned manufacturing method provided by the embodiments of the present disclosure, an orthographic projection of the terminal portion of the injection region on the base substrate and an orthographic projection of a region, which is electrically contacted with the drain electrode, of the active layer on the base substrate are overlapped with each other; and an orthographic projection of the terminal portion of the oxidation region on the base substrate and an orthographic projection of a region, which is electrically contacted with the source electrode, of the active layer on the base substrate are overlapped with each other.

In a possible implementation, in the above-mentioned manufacturing method provided by the embodiments of the present disclosure, forming of the pattern includes the control gate, the floating gate, the injection layer, the active layer, the gate electrode, and the source electrode and the drain electrode, which are opposite to each other and electrically connected to the active layer, on the base substrate includes: forming a pattern of the control gate on the base substrate; forming a pattern of the floating gate on the base substrate formed with the pattern of the control gate, in which the pattern of the control gate and the pattern of the floating gate are patterned by adopting an identical mask; forming a pattern of the injection layer on the base substrate formed with the pattern of the floating gate; forming a pattern of the active layer on the base substrate formed with the pattern of the injection layer; forming a pattern of the gate electrode on the base substrate formed with the pattern of the active layer; and forming a pattern of the source electrode and the drain electrode on the base substrate formed with the pattern of the gate electrode.

In a possible implementation, in the above-mentioned manufacturing method provided by the embodiments of the present disclosure, forming of the pattern includes the control gate, the floating gate, the injection layer, the active layer, the gate electrode, and the source electrode and the drain electrode, which are opposite to each other and electrically connected to the active layer, on the base substrate includes: forming a pattern of the gate electrode on the base substrate; forming a pattern of the active layer on the base substrate formed with the pattern of the gate electrode; forming a pattern of the injection layer on the base substrate formed with the pattern of the active layer; forming a pattern of the floating gate on the base substrate formed with the pattern of the injection layer; forming a pattern of the control gate on the base substrate formed with the pattern of the floating gate, in which the pattern of the control gate and the pattern of the floating gate are patterned by adopting an identical mask; and forming a pattern of the source electrode and the drain electrode on the base substrate.

In a possible implementation, in the above-mentioned manufacturing method provided by the embodiments of the present disclosure, forming of the pattern of the floating gate includes: depositing a metal layer, and performing a patterning process to the metal layer, so as to form the pattern of the floating gate; coating a photoresist on the pattern of the floating gate formed and performing exposure and development processes; removing the photoresist corresponding to the oxidation region and reserving the photoresist corresponding to the injection region, after the exposure and development processes are performed; and performing an anodic oxidation process to a region, in which the photoresist is removed, of the floating gate, so as to form the oxidation region of the floating gate, and form the injection region of the floating gate in a region outside the oxidation region.

In a possible implementation, the above-mentioned manufacturing method provided by the embodiments of the present disclosure further includes: converting at least a portion of the pattern of the active layer formed to a conductor.

In a possible implementation, the above-mentioned manufacturing method provided by the embodiments of the present disclosure further includes: forming a buffer layer between the control gate and the floating gate on the base substrate; and forming a gate insulation layer between the active layer and the gate electrode on the base substrate.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

DETAILED DESCRIPTION

Figure 1:
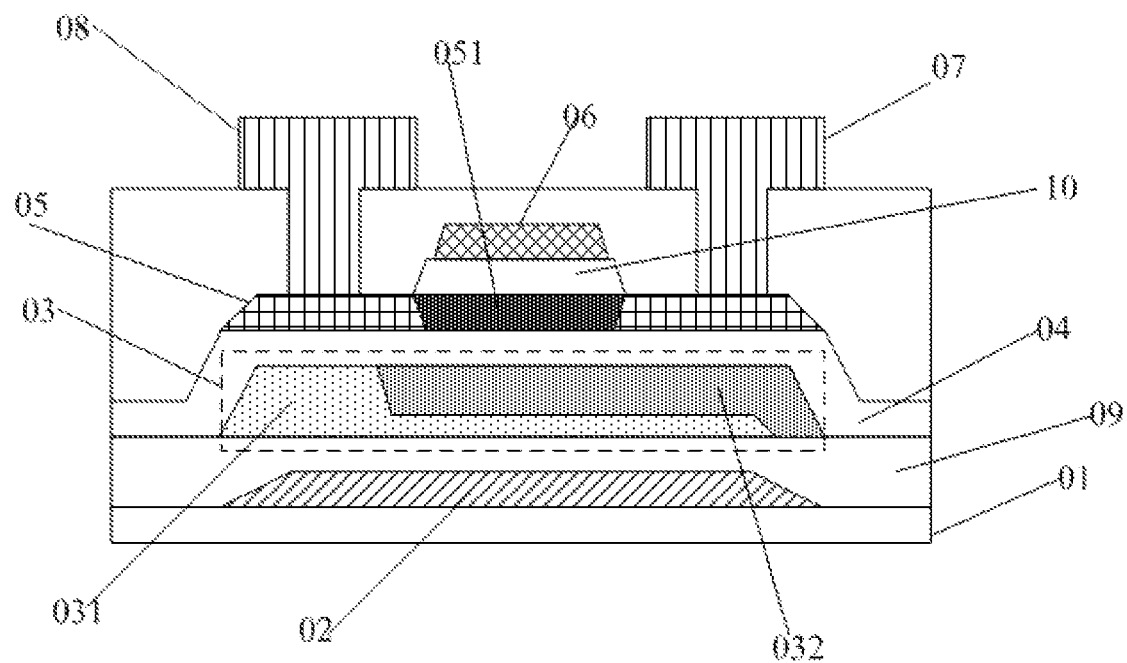
FIG. 1 is a schematically structural view of a thin-film transistor provided by the embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, there are still some problems to be solved in the thin film transistors (TFTs) applied in display panels. The problems mainly comprise the followings. Firstly, pixel capacitors have poor voltage retention capabilities. Because liquid crystals are driven by voltages, good voltage retention capabilities of the pixel capacitors are necessary to obtain good display images. However, negative drift of the threshold voltage of the TFT can occur in a case that the TFT works for a long time or is illuminated by light, which causes problems of an increase of leak current and charging errors, and the problems have adverse effects on the quality of the displayed images. Secondly, for the TFT, which functions as a driving transistor, in the pixel circuit of the organic electroluminescent display panel (OLED display panel), the negative drift of the threshold voltage can cause problems of a blurred display image and an increase of static power consumption. A method to alleviate the negative drift of the threshold voltage of the TFT is to provide a light-shielding layer at the bottom of the TFT, and design a complex compensation circuit to compensate the threshold voltage. However, the method increases the complexity of designing the display panel, and lowers the possibility of reducing the cost of the display panel.

Therefore, how to alleviate the drift of the threshold voltage of the TFT, so as to improve the quality of the display image of the display panel, is an urgent technical problem to be solved for those skilled in the art.

For example, the transistors can be divided into N type transistors (i.e., PMOS transistors, P type metal oxide semiconductor transistors) and P type transistors (i.e., NMOS transistors, N type metal oxide semiconductor transistors) according to the characteristics of the transistors. For the sake of clarity, the embodiments of the present disclosure detailedly describe the technical solution of the present disclosure by taking the case that the thin-film transistor is the P type transistor as an example, but the thin-film transistors of the embodiments of the present disclosure are not limited to P type transistors, and those skilled in the art can implement one or more of the transistors of the embodiments of the present disclosure using N type transistors according to actual demands.

The embodiments of the present disclosure provide a thin-film transistor and a manufacturing method thereof, a display substrate and a display device, which can alleviate relevant issues caused by the negative drift of the threshold voltage of the thin-film transistor.

At least one embodiment of the present disclosure provide a thin-film transistor. The thin-film transistor includes: a control gate, a floating gate, an injection layer, an active layer, a gate electrode, a source electrode and a drain electrode, which are provided on a base substrate, in which the source electrode and the drain electrode are opposite to each other and respectively electrically connected to the active layer. The injection layer is provided between the floating gate and the active layer; the active layer is provided between the control gate and the gate electrode; and the floating gate is provided between the control gate and the active layer.

Non-limitive descriptions are given to illustrate the thin-film transistor provided by the embodiments of the present disclosure in the following with reference to a plurality of examples. As described in the following, in case of no conflict, different features in these specific examples may be combined so as to obtain new examples, and the new examples are also fall within the scope of present disclosure.

The embodiments of the present disclosure provide a thin-film transistor, and the thin-film transistor may be applied in a display substrate. For example, as illustrated in FIG. 1, the thin-film transistor may include: a control gate 02, a floating gate 03, an injection layer 04, an active layer 05 (for example, the active layer may include a region 051 converted to a conductor), a gate electrode 06, a source electrode 07 and a drain electrode 08 on the base substrate 01, in which the source electrode 07 and the drain electrode 08 are opposite to each other and respectively electrically connected to the active layer 05. The injection layer 04 is provided between the floating gate 03 and the active layer 05, the active layer 05 is provided between the control gate 02 and the gate electrode 06, and the floating gate 03 is provided between the control gate 02 and the active layer 05.

For example, the base substrate 01 may be a glass substrate, a quartz substrate, a plastic substrate (such as a polyethylene terephthalate (PET) substrate), or a substrate made of other suitable materials. For example, the source electrode 07 and the drain electrode 08 may be respectively formed of one or more of the following materials: copper, aluminum, aluminum alloy or other suitable materials. For example, the injection layer 04 may be formed of silicon oxide (SiOx), but the embodiments of the present disclosure are not limited to this case, according to specific implementation demands, the injection layer 04 may also be formed of silicon oxynitride (SiNxOy), silicon nitride (SiNx), or other suitable materials.

For example, the active layer may be formed of an oxide semiconductor material, but the embodiments of the present disclosure are not limited to this case. For example, the oxide semiconductor material, for example, may include ZnO, MgZnO, Zn—Sn—O (ZTO), In—Zn—O (IZO), SnO2, Ga2O3, In—Ga—O (IGO), In2O3, In—Sn—O (ITO), In—Ga—Zn—O (IGZO), In—Zn—Sn—O (IZTO), In—Ga—Zn—Sn—O (IGZTO), InAlZnO(IAZO), or the like, but the embodiments of the present disclosure are not limited to the above-mentioned specific oxide semiconductor materials.

For example, in the above-mentioned thin-film transistor provided by the embodiments of the present disclosure, by providing the floating gate (for example, the floating gate may include an injection region and an oxidation region) and providing a very thin injection layer between the active layer and the floating gate, electrons in the active layer corresponding to the drain electrode may pass through the injection layer and be injected into the floating gate, so that positive drift of the threshold voltage of the thin-film transistor can be realized and issues caused by the negative drift of the threshold voltage of the thin-film transistor can be alleviated.

For example, the principle of alleviating negative drift of the threshold voltage of the thin-film transistor provided by the embodiments of the present disclosure is illustratively described in the following with reference to FIG. 1 and FIG. 8.

Figure 8:
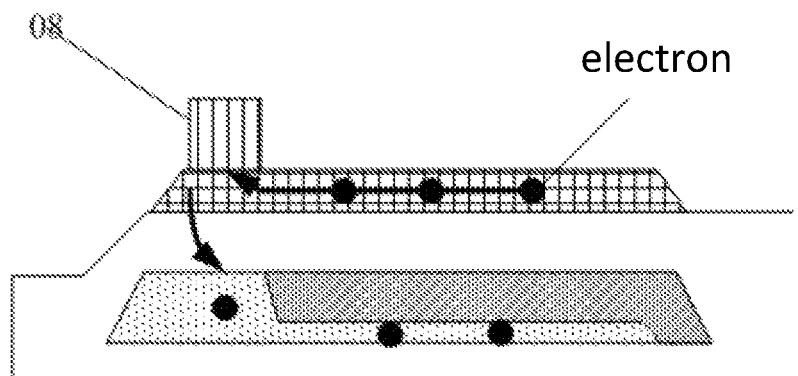
FIG. 8 is a schematic diagram of an electron injection method provided by the embodiments of the present disclosure.

For example, as illustrated in FIG. 1 and FIG. 8, in the case that a positive voltage is applied to the gate electrode 06, the gate electrode 06 repels holes and attracts electrons, and therefore, at least part of the electrons (free electrons) in the active layer 05 is distributed at a surface, which is close to the gate electrode 06, of the active layer 05, and at least part of the holes in the active layer 05 is distributed at a surface, which is away from the gate electrode 06, of the active layer 05. The number of the free electrons distributed at the surface, which is close to the gate electrode 06, of the active layer 05 is increased along with an increase of the positive voltage applied to the gate electrode 06. In the case that the positive voltage applied to the gate electrode 06 is larger than the threshold voltage, a channel can be formed at the surface, which is close to the gate electrode 06, of the active layer 05, and the free electrons can move from the source electrode 07 to the drain electrode 08. Because the voltage applied between the source electrode 07 and the drain electrode 08 allows the energy of the free electrons to be increased, the free electrons may pass through the injection layer and be injected into the injection region 031 of the floating gate 03 in the case that the energy of the free electrons is sufficiently large (for example, in the case that the free electrons move into the region, which corresponds to the drain electrode 08, of the active layer 05). The free electrons, which are injected into the injection region 031 of the floating gate 03, allow the floating gate 03 to be negatively charged (i.e., allow a negative voltage to be applied to the floating gate 03). According to the characteristics of double gate devices, the negative voltage applied to the floating gate 03 may increase the threshold voltage of the thin-film transistor (i.e., positive drift), and therefore, the thin-film transistor provided by the embodiments of the present disclosure can have the function of suppressing the negative drift of the threshold voltage.

For example, in the case that the negative drift of the threshold voltage of the thin-film transistor is existed (for example, the negative drift of the threshold voltage is caused by light illumination or the increase of the temperature), that is, the threshold voltage is decreased and the on-state current Ids between the source electrode and the drain electrode is increased, and therefore, the number of the electrons, which pass through the injection layer 04 and are injected into the injection region 031 of the floating gate 03 is increased and the voltage applied to the floating gate 03 is accordingly increased. In this case, the decrement of the number of the free electrons in the channel is increased, that is, the increment of the threshold voltage of the thin-film transistor is increased, and therefore, the thin-film transistor provided by the embodiments of the present disclosure has a negative feedback effect on the change of the threshold voltage, and thus the single direction drift (for example, the negative drift) of the threshold voltage of the thin-film transistor can be avoided, and the performance of the thin-film transistor can be improved.

For example, by providing the control gate, a thickness (for example, the sum of a thickness of the control gate 02 and a thickness of the floating gate 03) of a light-shielding layer provided below the active layer 05 is increased, and therefore the intensity of the light incident onto the active layer 05 is decreased, and the intensity of the leak current caused by the light is decreased, so that the voltage retention capacity of the thin-film transistor is improved. For another example, by applying a negative gate voltage on the control gate, not only the charges (the free electrons) stored in the floating gate can be reduced to zero, but also a better light shielding effect can be realized, and therefore, the thin-film transistor can be initialized, and the data writing accuracy for each time can be guaranteed.

For example, in some embodiments, the floating gate 03 may be a plate-shape structure, so that the manufacturing processes can be simplified. For another example, in some other embodiments, the floating gate 03 may also include an injection region 031 and an oxidation region 032; both the injection region 031 and the oxidation region 032 include a terminal portion and an extension portion; the extension portion of the oxidation region 032 is provided on a surface, which faces the active layer 05, of the extension portion of the injection region 031. For example, by providing the extension portion of the oxidation region 032 on the surface, which faces the active layer 05, of the extension portion of the injection region 031, a distance between the extension portion of the injection region 031 and the active layer 05 in a direction perpendicular to the base substrate 01 can be increased; in this case, the possibility that the free electrons are injected into the injection region 031 of the floating gate 03 through a portion, which corresponds to the channel region (for example, corresponds to the region 051 converted to a conductor), of the floating gate 03 can be decreased (i.e., the possibility of current leaking is decreased), and therefore, the reliability of the thin-film transistor can be increased.

For example, in some embodiments, a thickness of the extension portion of the oxidation region 032 (for example, a thickness of the extension portion of the oxidation region 032 in the direction perpendicular to the base substrate 01) is larger than a thickness of the extension portion of the injection region 031 (for example, a thickness of the extension portion of the injection region 031 in the direction perpendicular to the base substrate 01), and therefore, the reliability of the thin-film transistor can be further increased. For another example, in some other embodiments, the thickness of the extension portion of the oxidation region 032 may also be smaller than or equal to the thickness of the extension portion of the injection region 031.

For example, in some embodiments, an orthographic projection of the terminal portion of the injection region 031 on the base substrate 01 and an orthographic projection of a region (or, the drain electrode 08), which is electrically contacted with the drain electrode 08, of the active layer 05 on the base substrate 01 are overlapped with each other (have an overlapping region), and therefore, the possibility of injecting the free electrons into the injection region 031 of the floating gate 03 can be increased, and the injection efficiency of the electrons can be increased. For another example, in some other embodiments, the orthographic projection of the terminal portion of the injection region 031 on the base substrate 01 and the orthographic projection of the drain electrode 08 on the base substrate 01 can be not overlapped with each other (i.e., can be spaced apart from each other).

For example, in some embodiments, an orthographic projection of the terminal portion of the oxidation region 032 on the base substrate 01 and an orthographic projection of a region, which is electrically contacted with the source electrode 07, of the active layer 05 on the base substrate 01 (or, an orthographic projection of the source electrode 07 on the base substrate 01) are overlapped with each other (have an overlapping region). For another example, in some other embodiments, the orthographic projection of the terminal portion of the oxidation region 032 on the base substrate 01 and the orthographic projection of the source electrode 07 on the base substrate 01 can be not overlapped with each other (i.e., can be spaced apart from each other).

For example, in a specific implementation, in the above-mentioned thin-film transistor provided by the embodiments of the present disclosure, a thickness of the injection layer may be no greater than 50 nanometers, and the thickness of the injection layer may be adjusted according to specific implementation demands, and no limitation will be given here. For example, in the case that the thickness of the injection layer is relatively small, the quality of the injection layer is relatively high, and therefore, by providing (for example, depositing) the injection layer with a relatively small thickness, the interface defects on the surface, which is away from the gate electrode, of the active layer can be reduced, and the switching characteristic of the thin-film transistor can be improved (for example, the mobility of the thin-film transistor is improved).

For example, an orthographic projection of the floating gate on the base substrate and an orthographic projection of the control gate on the base substrate are completely overlapped with each other, that is, the floating gate and the control gate can be formed by an identical mask, and therefore, the manufacturing cost can be reduced. For example, the injection region and the oxidation region are in direct contact with each other in the direction perpendicular to the base substrate.

For example, as illustrated in FIG. 1, in a specific implementation, the thin-film transistor provided by the embodiments of the present disclosure may be a top gate thin-film transistor. For example, as illustrated in FIG. 1, the control gate 02 is provided above the base substrate 01 (for example, the control gate 02 and the base substrate 01 are in direct contact); the floating gate 03 is provided above the control gate 02 (i.e., the floating gate 03 is provided at a side, which is away from the base substrate 01, of the control gate 02); the active layer 05 is provided above the floating gate 03 (i.e., the active layer 05 is provided at a side, which is away from the base substrate 01, of the floating gate 03), and the gate electrode 06 is provided above the active layer 05 (i.e., the gate electrode 06 is provided at a side, which is away from the base substrate 01, of the active layer 05).

Figure 2:
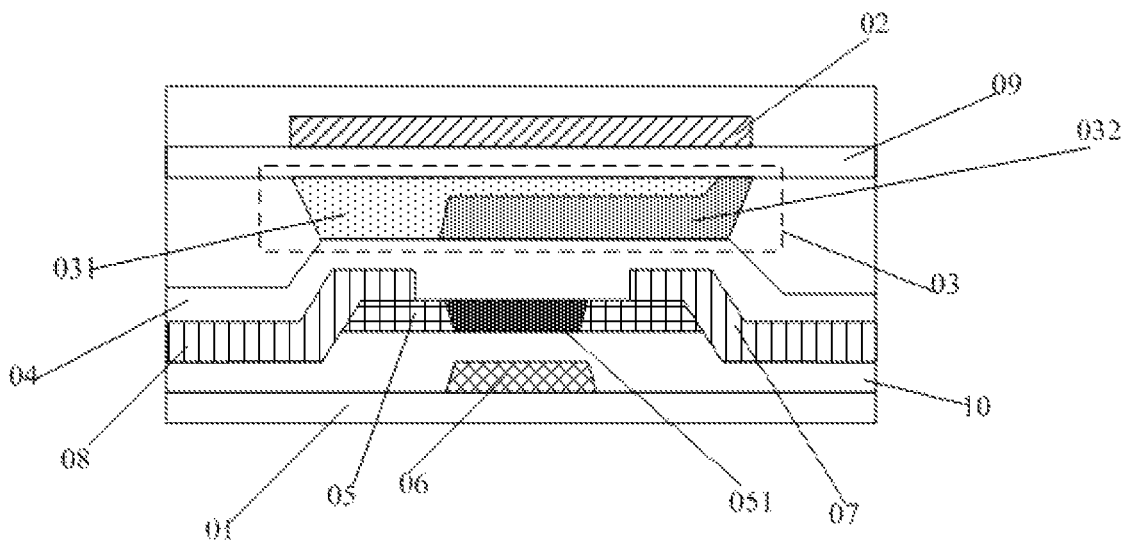
FIG. 2 is a schematically structural view of another thin-film transistor provided by the embodiments of the present disclosure.

For another example, the thin-film transistor provided by the embodiments of the present disclosure may be the bottom gate thin-film transistor as illustrated in FIG. 2. For example, as illustrated in FIG. 2, the gate electrode 06 is provided above the base substrate 01 (for example, the gate electrode 06 and the base substrate 01 are in direct contact); the active layer 05 is provided above the gate electrode 06 (i.e., the active layer 05 is provided at a side, which is away from the base substrate 01, of the gate electrode 06), the floating gate 03 is provided above the active layer 05 (i.e., the floating gate 03 is provided at a side, which is away from the base substrate 01, of the active layer 05), and the control gate 02 is provided above the floating gate 03 (i.e., the control gate 02 is provided at a side, which is away from the base substrate 01, of the floating gate 03).

The types of the thin-film transistor are not limited by the embodiments of the present disclosure, and both the top gate thin-film transistor and the bottom gate thin-film transistor may adopt the design concept provided by the presented disclosure, so as to alleviate the issues caused by the negative drift of the threshold voltage of the thin-film transistor.

For example, in a specific implementation, as illustrated in FIG. 1 and FIG. 2, the above-mentioned thin-film transistor provided by the embodiments of the present disclosure may further include a buffer layer 09 provided between the control gate 02 and the floating gate 03, and a gate insulation layer 10 provided between the active layer 05 and the gate electrode 06.

For example, the buffer layer 09 may be formed of an inorganic or organic material. For example, the buffer layer 09 may be formed of organic resin, silicon oxide (SiOx), silicon oxynitride (SiNxOy), or silicon nitride (SiNx). For example, a material of the gate insulation layer 10 may be silicon oxide (SiOx), silicon oxynitride (SiNxOy), silicon nitride (SiNx) or other suitable materials.

Furthermore, it should be understood by those skilled in the art that the thin-film transistor may further include other function layers such as a passivation layer and so on, the arrangement of these layers may refer to conventional technologies, and no further descriptions will be given here. For example, the passivation layer can be formed of organic resin, silicon oxide (SiOx), silicon oxynitride (SiNxOy), or silicon nitride (SiNx).

It should be understood that, the source electrode and the drain electrode of the transistors adopted in the embodiments of the present disclosure can be symmetrical in structure, and therefore, there is no difference in the structures of the source electrode and the drain electrode of the transistor. In the embodiments of the present disclosure, in order to distinguish two terminals of the transistors other than the gate electrode, which used as the control terminal, one terminal of the two terminals is denoted as a first terminal, and the other terminal of the two terminals is denoted as a second terminal, and therefore, the first terminal and the second terminal of all of or part of the transistors in the embodiments of the present disclosure can be interchangeable according to requirements. For example, the first terminal of the transistor in the embodiments of the present disclosure can be a source electrode, and the second terminal of the transistor can be a drain electrode; or alternatively, the first terminal of the transistor can be a drain electrode, and the second terminal of the transistor can be a source electrode. Furthermore, the transistors can be divided into N type transistors and P type transistors according to the characteristics of the transistors, and the types of the transistors are not limited by the embodiments of the present disclosure, and those skilled in the art can implement the embodiments of the present disclosure with N type transistors and/or P type transistors according to actual demands.

Figure 10:
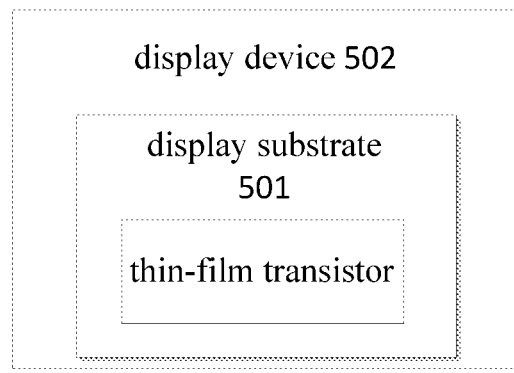
FIG. 10 is an exemplary block diagram of a display substrate and a display device provided by the embodiments of the present disclosure.

At least one embodiment of the present disclosure further provides a display substrate 501. For example, as illustrated in FIG. 10, the display substrate 501 includes the thin-film transistor provided by any one of the embodiments of the present disclosure.

For example, the display substrate 501 may be an organic electroluminescent display panel. For example, as illustrated in FIG. 9b, the organic electroluminescent display panel may include a driving transistor (i.e., a thin-film transistor D located at the right of FIG. 9b), a switching transistor (i.e., a thin-film transistor M located at the left of FIG. 9b) and a control terminal (i.e., a floating gate type thin-film transistor G2 located at the left of FIG. 9b). For example, the switching transistor includes a first control terminal G1.

For example, both the driving transistor and the switching transistor may be implemented as thin-film transistors; a control gate of the driving transistor and a control gate of the switching transistor may be electrically connected to a same control terminal, and therefore, the initialization (i.e., the charges stored in the transistors are reduced to zero) of the driving transistor and the switching transistor can be realized simultaneously.

For example, according to specific implementation demands, the organic electroluminescent display panel may further include a storage capacitor Cst, a light-emitting device (an organic light-emitting diode) OLED, a first power source terminal VDD, a second power source terminal VSS and a data line Dat. For example, detail information of the storage capacitor Cst, the organic light-emitting diode OLED, the first power source terminal VDD, and the second power source terminal VSS may refer to conventional technologies of the organic electroluminescent display panel, and no further descriptions will be given here.

At least one embodiment of the present disclosure further provides a display device 502. For example, as illustrated in FIG. 10, the display device 502 may include the thin-film transistor provided by any one of the embodiments of the present disclosure or the display substrate 501 provided by any one of the embodiments of the present disclosure.

For example, the display device 502 may be any product or device that has display function, such as a cell phone, a tablet computer, a television, a display screen, a laptop, a digital photo frame, a navigator and so on. The display device achieves an imaging function.

It should be noted that those skilled in the art should understand that other indispensable components (such as a thin-film transistor control device, an image data encoding/decoding device, a row scan driver, a column scan driver, a clock circuit or the like) of the display substrate 501 and the display device 502 may adopt conventional and suitable components, no further descriptions will be given here and it should not be construed as a limitation on the embodiments of the present disclosure.

Based on the same inventive concept, the embodiments of the present disclosure provide a manufacturing method of the thin-film transistor provided by the embodiments of the present disclosure, the manufacturing method includes: forming a pattern including the control gate, the floating gate, the injection layer, the active layer, the gate electrode, the source electrode and the drain electrode on the base substrate. The source electrode and the drain electrode are opposite to each other and respectively electrically connected to the active layer; the injection layer is provided between the floating gate and the active layer; the active layer is provided between the control gate and the gate electrode; and the floating gate is provided between the control gate and the active layer, and the floating gate includes an injection region and an oxidation region.

For example, both the injection region and the oxidation region include a terminal portion and an extension portion; the extension portion of the oxidation region is provided on a surface, which faces the active layer, of the extension portion of the injection region. For example, a thickness of the extension portion of the oxidation region is larger than a thickness of the extension portion of the injection region.

For example, an orthographic projection of the terminal portion of the injection region on the base substrate and an orthographic projection of a region, which is electrically contacted with the drain electrode, of the active layer on the base substrate are overlapped with each other (have an overlapping region). For example, an orthographic projection of the terminal portion of the oxidation region on the base substrate and an orthographic projection of a region, which is electrically contacted with the source electrode, of the active layer on the base substrate are overlapped with each other (have an overlapping region). For example, a thickness of the injection layer is no greater than 50 nanometers.

Figure 3:
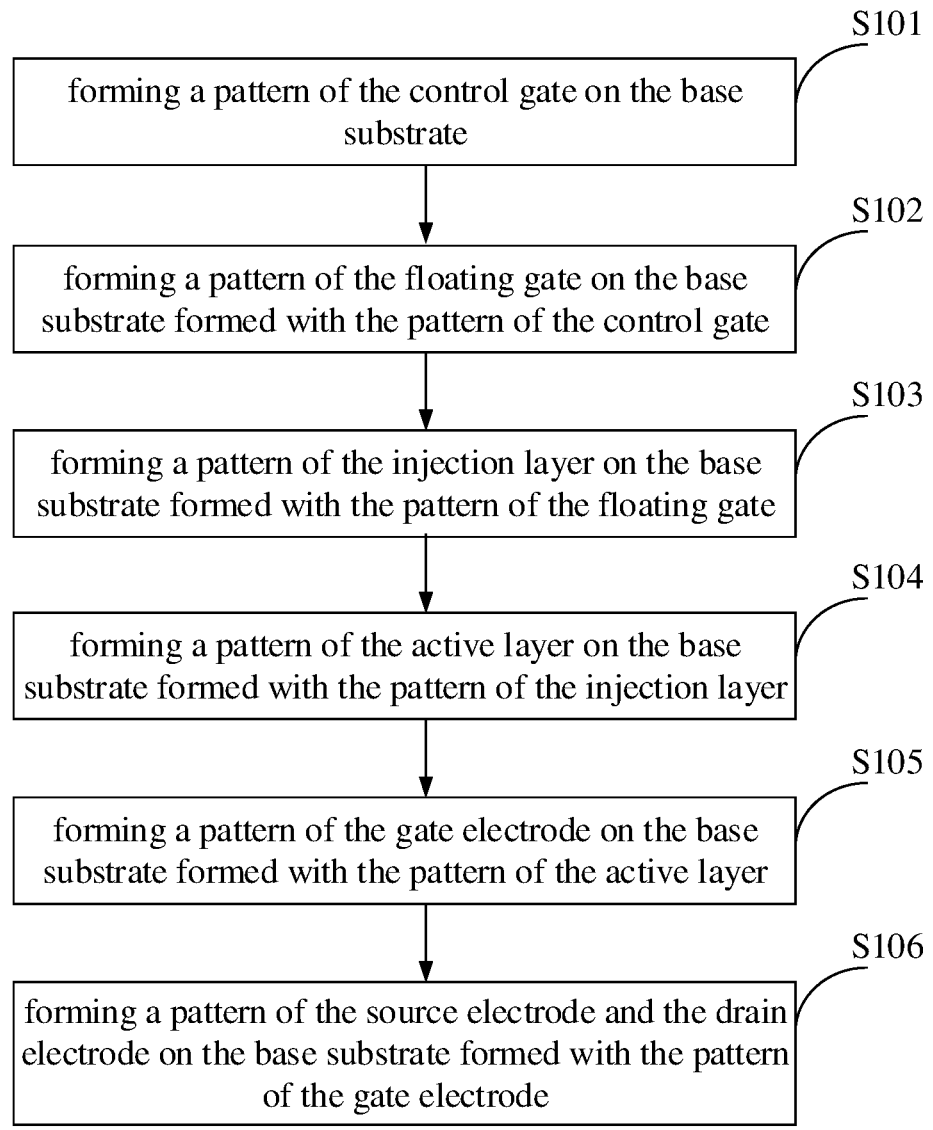
FIG. 3 is an exemplary flow chart of a manufacturing method of a thin-film transistor provided by the embodiments of the present disclosure.

For example, in a specific implementation, in the above-mentioned manufacturing method provided by the embodiments of the present disclosure, as illustrated in FIG. 3, forming of the pattern including the control gate, the floating gate, the injection layer, the active layer, the gate electrode, and the source electrode and the drain electrode, which are opposite to each other and electrically connected to the active layer, on the base substrate may include the following steps.

Figure 4A:
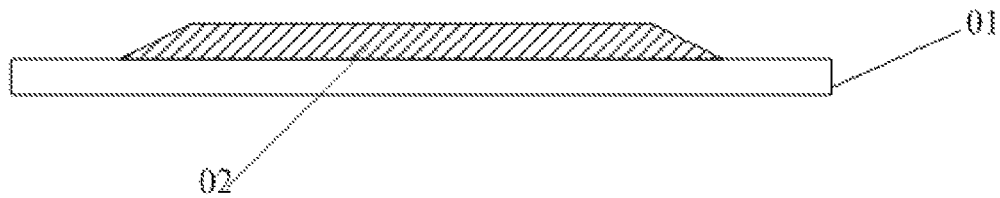
FIG. 4a is a first schematic diagram of a manufacturing process of a thin-film transistor provided by the embodiments of the present disclosure.

In step S101, forming a pattern of the control gate on the base substrate, and the control gate 02 formed refers to FIG. 4a.

Figure 4B:
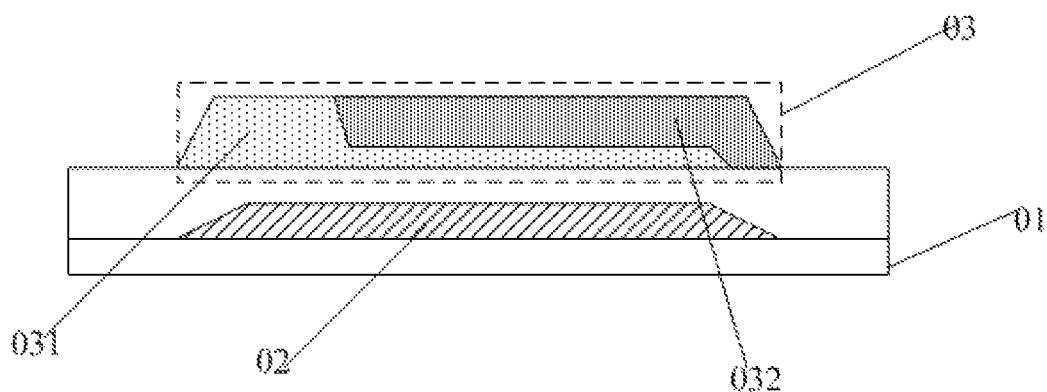
FIG. 4b is a second schematic diagram of a manufacturing process of a thin-film transistor provided by the embodiments of the present disclosure.

In step S102, forming a pattern of the floating gate on the base substrate formed with the pattern of the control gate (refer to FIG. 4b).

For example, the pattern of the control gate and the pattern of the floating gate may be formed by patterning processes adopting an identical mask, so as to reduce cost; the floating gate 03 formed is illustrated in FIG. 4b. Furthermore, the control gate and the floating gate can achieve a double light shielding effect on the active layer, and therefore, a better light shielding effect can be achieved compared with the case that only one light-shielding layer is adopted.

Figure 4C:
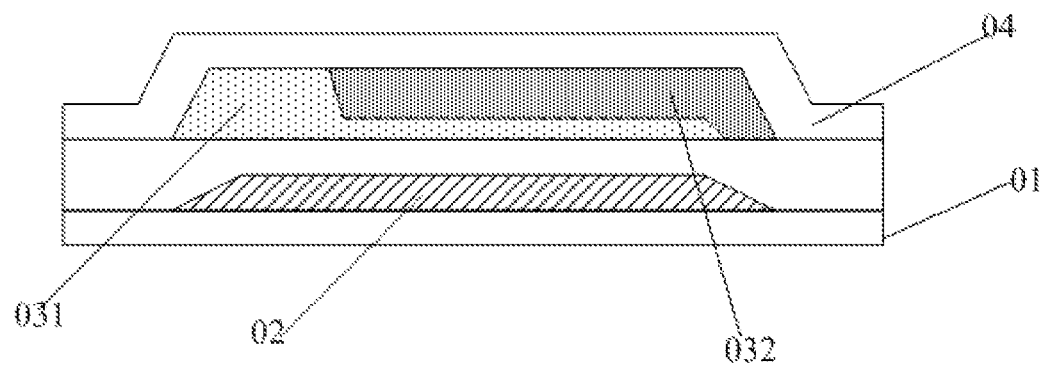
FIG. 4c is a third schematic diagram of a manufacturing process of a thin-film transistor provided by the embodiments of the present disclosure.

In step S103, forming a pattern of the injection layer on the base substrate formed with the pattern of the floating gate, and the injection layer 04 formed is illustrated in FIG. 4c.

In step S104, forming a pattern of the active layer on the base substrate formed with the pattern of the injection layer.

In step S105, forming a pattern of the gate electrode on the base substrate formed with the pattern of the active layer.

In step S106, forming a pattern of the source electrode and the drain electrode on the base substrate formed with the pattern of the gate electrode. The active layer 05, the gate electrode 06, the source electrode 07 and the drain electrode 08 formed may refer to FIG. 1.

Figure 5:
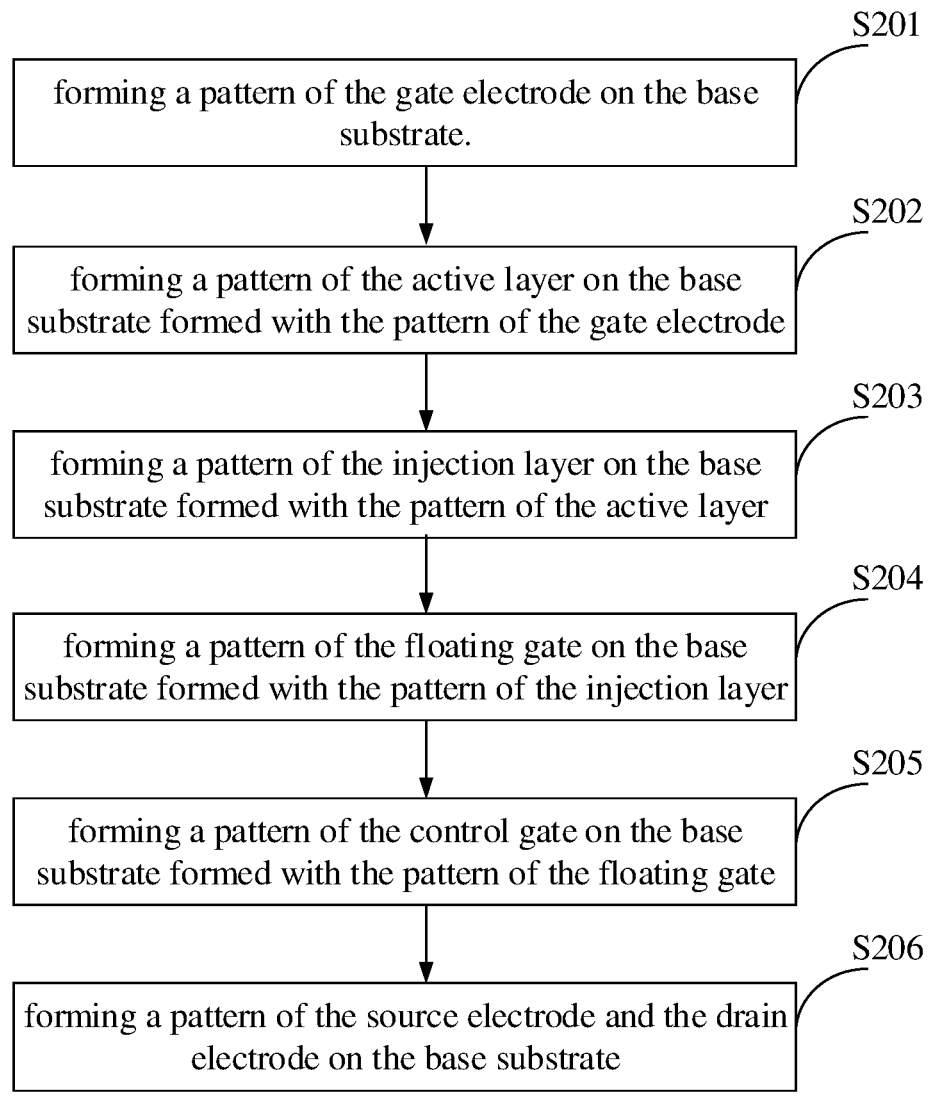
FIG. 5 an exemplary flow chart of a manufacturing method of another thin-film transistor provided by the embodiments of the present disclosure.

It should be noted that, the thin-film transistor formed by the above-mentioned manufacturing method is a top-gate type transistor, while a bottom-gate type thin-film transistor may be formed by the manufacturing method as illustrated in FIG. 5, and the manufacturing method includes the following steps.

In step S201, forming a pattern of the gate electrode on the base substrate.

In step S202, forming a pattern of the active layer on the base substrate formed with the pattern of the gate electrode.

In step S203, forming a pattern of the injection layer on the base substrate formed with the pattern of the active layer.

In step S204, forming a pattern of the floating gate on the base substrate formed with the pattern of the injection layer.

In step S205, forming a pattern of the control gate on the base substrate formed with the pattern of the floating gate;

for example, the pattern of the control gate and the pattern of the floating gate may be formed by patterning processes adopting an identical mask.

In step S206, forming a pattern of the source electrode and the drain electrode on the base substrate.

For example, for both the manufacturing method of the bottom gate type thin-film transistor and the manufacturing method of the top gate type thin-film transistor, the manufacturing processes of each layer include manufacturing processes such as depositing a film, etching, and the like. The manufacturing processes of each layer may refer to conventional technologies, and no further descriptions will be given here.

Figure 6:
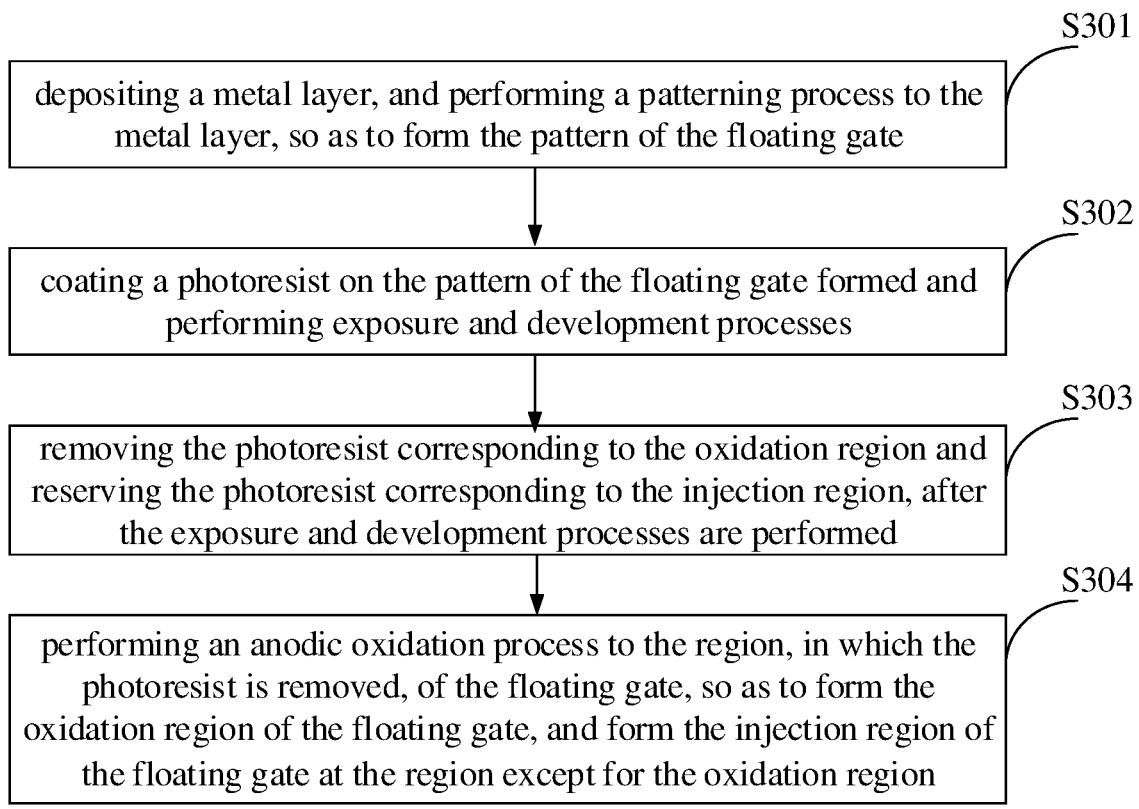
FIG. 6 is an exemplary flow chart of a manufacturing method of a floating gate provided by the embodiments of the present disclosure.

For example, in a specific implementation, in the above-mentioned manufacturing method provided by the embodiments of the present disclosure, as illustrated in FIG. 6, forming of the pattern of the floating gate may include the following steps.

In step S301, depositing a metal layer, and performing a patterning process to the metal layer, so as to form the pattern of the floating gate.

In step S302, coating a photoresist on the pattern of the floating gate formed and performing exposure and development processes.

In step S303, removing the photoresist corresponding to the oxidation region and reserving the photoresist corresponding to the injection region, after the exposure and development processes are performed.

In step S304, performing an anodic oxidation process (for example, performing an anodic oxidation process by applying a voltage) to a region, in which the photoresist is removed, of the floating gate, so as to form the oxidation region of the floating gate, and form the injection region of the floating gate in the region outside the oxidation region.

Figure 7:
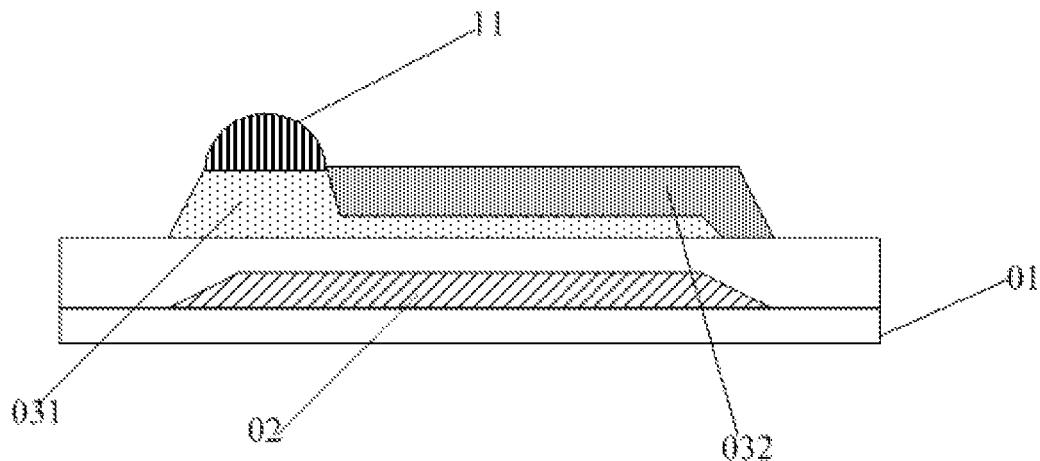
FIG. 7 is a schematic diagram of a floating gate, formed with an injection region and an oxidation region, provided by the embodiments of the present disclosure.

For example, after the floating gate is oxidized, the formed injection region 031 and the formed oxidation region 032 are illustrated in FIG. 7, in which a terminal portion of the injection region 031 is covered by a photoresist 11. Furthermore, an orthographic projection of the terminal portion of the injection region on the base substrate and an orthographic projection of the region, which is electrically contacted with the drain electrode, of the active layer on the base substrate are overlapped with each other (have an overlapping region), and therefore, injection of the electrons at a terminal corresponding to the drain electrode can be guaranteed, and an electron injection method is illustrated in FIG. 8. For example, an orthographic projection of the terminal portion of the oxidation region on the base substrate and an orthographic projection of a region, which is electrically contacted with the source electrode, of the active layer on the base substrate may be overlapped with each other (have an overlapping region). For example, the extension portion of the oxidation region is provided at a surface, which faces the active layer, of the extension portion of the injection region, and a thickness of the extension portion of the oxidation region is larger than a thickness of the extension portion of the injection region; in this way, the possibility of injecting the electrons at the oxidation region of the floating gate is decreased and the reliability of the operation of the device can be guaranteed.

For example, in a specific implementation, in the above-mentioned manufacturing method provided by the embodiments of the present disclosure, the manufacturing method may further include: converting at least a portion of the pattern of the active layer formed to a conductor (for example, by adopting a plasma dry etching method); forming a buffer layer between the control gate and the floating gate on the base substrate; and forming a gate insulation layer between the active layer and the gate electrode on the base substrate. For example, the performance of the thin-film transistor provided by the embodiments of the present disclosure is improved for at least the following reasons. For example, the electrons in the active layer may be injected into the injection region of the floating gate via the injection layer, the electrons in the injection region may function at the conducting region of the active layer, and allow the positive drift of the threshold voltage of the thin-film transistor to be realized, and the value of the positive drift is relevant with the intensity of the leak current, that is, the number of the electrons injected is relevant with the thickness and the insulation of the injection layer provided, and therefore, the injecting efficiency of the electrons may be precisely controlled by adjusting the manufacturing parameters.

The manufacturing processes for manufacturing the thin-film transistor (by taking the case that the thin-film transistor is a bottom gate type thin-film transistor as an example) provided by at least one embodiment is detailedly described in the following with reference to a specific embodiment, and the manufacturing processes include the following steps.

a) depositing a layer of metal after the base substrate is cleaned by a standard method, forming the pattern of the control gate by etching, and then depositing an insulation material, as a buffer layer, on the pattern of the control gate.

b) performing a pre-deposition cleaning process to the buffer layer, and then depositing a layer of metal, which is thick and easy to be oxidized, on the buffer layer; and performing a patterning process to the layer of metal by adopting the mask for forming the control gate, so as to form the pattern of the floating gate; in which the metal may be aluminum (Al), tantalum (Ta), hafnium (Hf), aluminum neodymium alloy (AlNd), or the like.

c) coating a photoresist on the metal of the floating gate, and only a small portion, which is close to the drain electrode, of the floating gate is covered by the photoresist after a development process; and then performing an anodic oxidation process to the metal of the floating gate by applying a voltage, so as to oxidize a portion of the metal of the floating gate into an insulation material, so as to form the injection region and the oxidation region.

d) depositing a thin layer of silicon oxide, which is function as the injection layer, with few interface defects by a chemical vapor deposition method.

e) depositing a conventional oxide semiconductor material on the injection layer, and coating a photoresist on the conventional oxide semiconductor material; and then forming the pattern of the active layer by a wet etching method; in which a material of the active layer, for example, may include semiconductor materials such as IGZO, IGZTO, ITO, IZO, IZTO, or the like.

f) depositing a layer of insulation material on the active layer, so as to form the gate insulation layer; a material of the gate insulation layer may adopt conventional insulation materials, or may also adopt dielectric materials with high dielectric constant (i.e., high k).

g) depositing a metal of the gate electrode by sputtering, and etching the metal of the gate electrode by a wet etching process and a dry etching process after a photolithography process is performed using a mask for the gate electrode, so as to form the pattern of the gate electrode; the metal material of the gate electrode may be commonly used metal materials such as molybdenum (Mo), AlNd, Hf, Ta, Mo—Nb alloy (MoNb), copper (Cu), or the like.

h) converting at least a portion of the active layer into a conductor by a plasma dry etching method.

i) depositing an insulating layer and forming via holes corresponding to the drain electrode and the source electrode in the insulating layer.

j) depositing a metal of the source electrode and the drain electrode, and forming the source electrode and the drain electrode by patterning the metal of the source electrode and the drain electrode through a photolithography process.

For example, in the case that the negative drift of the threshold voltage of the thin-film transistor is existed, the number of the electrons accumulated on the floating gate is increased along with an increase of the leak current, and therefore, a negative feedback effect to the threshold voltage is realized. Furthermore, by applying a negative gate voltage on the control gate located at bottom, the charges stored in the floating gate can be reduced to zero, and thus the thin-film transistor can be initialized, and the data writing accuracy for each time can be guaranteed. In the case that the thin-film transistor provided by the embodiments of the present disclosure functions as a switching TFT, after the data is written, the threshold voltage (VTH) of the TFT may be allowed to be increased slightly according to specific implementation demands; in this case, the turn-off (for example, turn-off completely) of the TFT can be guaranteed when applying a voltage of 0 V on the top gate, and thus the leak current of a pixel capacitor can be reduced and the display quality can be improved.

Figure 9A:
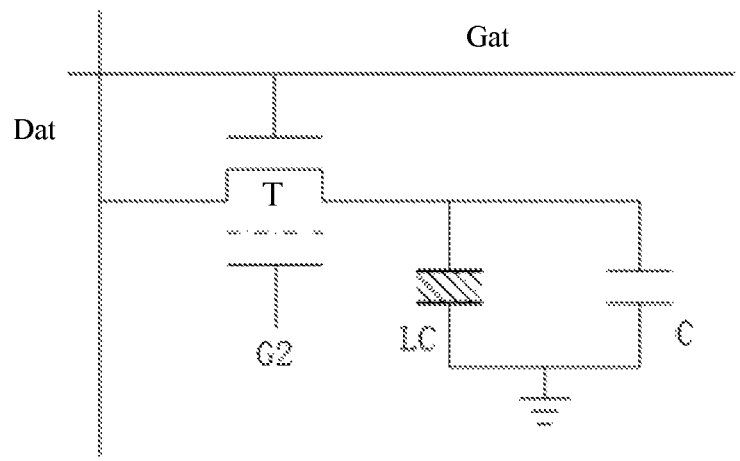
FIG. 9a is a schematically structural view of a pixel circuit of a liquid crystal display panel provided by the embodiments of the present disclosure.
Figure 9B:
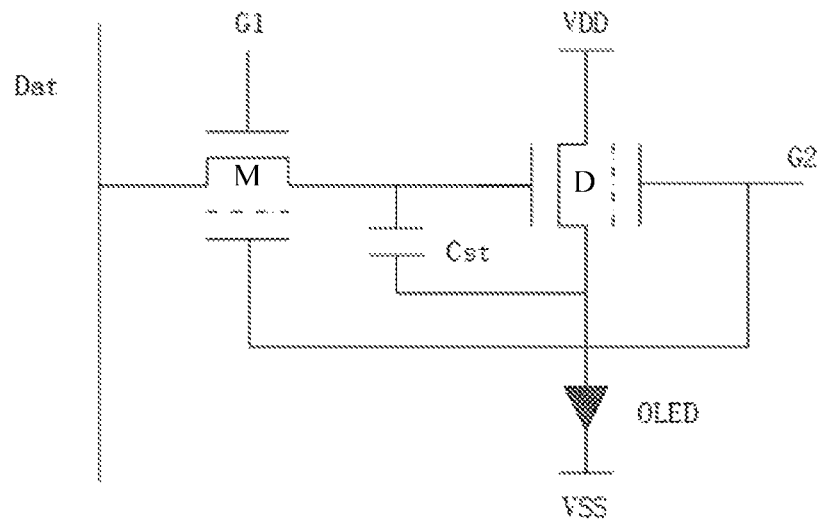
FIG. 9b is a schematically structural view of a pixel circuit of an OLED display panel provided by the embodiments of the present disclosure.

For example, the thin-film transistor provided by the presented disclosure may be applied in the pixel circuits of the liquid crystal display panel and the OLED display panel, and the circuit structures are respectively illustrated in FIG. 9a and FIG. 9b. The circuit structure as illustrated in FIG. 9a mainly includes a transistor T, a liquid crystal LC and a capacitor C; the circuit structure as illustrated in FIG. 9b mainly includes a switching transistor M, a driving transistor D, a storage capacitor Cst, and a light-emitting device OLED. In the case that the thin-film transistor functions as the switching transistor of the liquid crystal display panel and the OLED display panel, the threshold voltage VTH of the thin-film transistor can be positively drifted for an appropriate value after the data is written, and therefore, the leak current can be reduced in the case that signals in a gate line Gat and a control terminal G1 are equal to 0 V, and thus charge storage capabilities of the capacitor C and the pixel capacitor Cst can be increased. Furthermore, before writing the data again, applying a negative gate electrode voltage on a control terminal G2, so as to initialize the TFT and guarantee the accuracy of the written data. In addition, in the OLED display panel, as illustrated in FIG. 9b, both the gate electrode of the switching transistor M and the gate electrode of the driving transistor D are connected to the control terminal G2, so that the initialization of the TFTs can be realized simultaneously. In the case that the negative drift (because of light illumination and device lifetime) of the threshold voltage VTH of the driving transistor D in the OLED occurs, leak current is increased, and the number of the electrons at the terminal corresponding to drain electrode is increased, and therefore the number of charges accumulated on the floating gate is increased; adjusting the threshold voltage VTH to allow the threshold voltage VTH to be positively drifted, the leak current is decreased, and therefore, the negative drift of the threshold voltage VTH can be counteracted. By adopting the thin-film transistor provided by the present disclosure in the pixel circuit of the OLED, the drift range of the threshold voltage VTH can be decreased, and the difficulty of designing the pixel compensation circuit is significantly decreased.

The embodiments of the present disclosure provide a thin-film transistor and a manufacturing method thereof, a display substrate and a display device. The thin-film transistor includes: a control gate, a floating gate, an injection layer, an active layer, a gate electrode, a source electrode and a drain electrode, which are provided on a base substrate, in which the source electrode and the drain electrode are opposite to each other and respectively electrically connected to the active layer; the injection layer is provided between the floating gate and the active layer; the active layer is provided between the control gate and the gate electrode; and the floating gate is provided between the control gate and the active layer. For example, in the thin-film transistor provided by the embodiments of the present disclosure, a very thin injection layer is provided between the active layer and the floating gate, the electrons in the active layer corresponding to the drain electrode may pass through the injection layer and be injected into the floating gate, so that the positive drift of the threshold voltage of the thin-film transistor can be realized and the issues caused by the negative drift of the threshold voltage of the thin-film transistor can be alleviated. For example, the injection layer deposited can also reduce the interface defects of the active layer, and improve the switching characteristic of the thin-film transistor. For another example, by applying a negative gate voltage on the control gate, the charges stored in the floating gate can be reduced to zero, and thus the thin-film transistor can be initialized, and the data writing accuracy for each time can be guaranteed.

For example, the floating gate may include an injection region and an oxidation region; both the injection region and the oxidation region include a terminal portion and an extension portion; the extension portion of the injection region and the extension portion of the oxidation region are laminated. For example, the thickness of the extension portion of the oxidation region is larger than the thickness of the extension portion of the injection region in the floating gate including the injection region and the oxidation region. For example, the orthographic projection of the terminal portion of the injection region on the base substrate and the orthographic projection of the region, which is electrically contacted with the drain electrode of the active layer on the base substrate are overlapped with each other. For example, the orthographic projection of the terminal portion of the oxidation region on the base substrate and the orthographic projection of the region, which is electrically contacted with the source electrode, of the active layer on the base substrate are overlapped with each other.

Although detailed description has been given above to the present disclosure with general descriptions and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

What is claimed is:

1. A thin-film transistor, comprising:
a control gate, a floating gate, an injection layer, an active layer, a gate electrode, a source electrode and a drain electrode, which are provided on a base substrate, wherein
the source electrode and the drain electrode are opposite to each other and respectively electrically connected to the active layer;
the injection layer is between the floating gate and the active layer;
the active layer is between the control gate and the gate electrode; and
the floating gate is between the control gate and the active layer;
wherein the floating gate comprises an injection region and an oxidation region;
the injection region comprises a first terminal portion and a first extension portion, and the oxidation region comprises a second terminal portion and a second extension portion; and
the second extension portion of the oxidation region is provided on a surface, which faces the active layer, of the first extension portion of the injection region.

2. The thin-film transistor according to claim 1, wherein a thickness of the second extension portion of the oxidation region is larger than a thickness of the first extension portion of the injection region.

3. The thin-film transistor according to claim 1, wherein an orthographic projection of the first terminal portion of the injection region on the base substrate and an orthographic projection of a region, which is electrically contacted with the drain electrode, of the active layer on the base substrate are overlapped with each other.

4. The thin-film transistor according to claim 1, wherein an orthographic projection of the second terminal portion of the oxidation region on the base substrate and an orthographic projection of a region, which is electrically contacted with the source electrode, of the active layer on the base substrate are overlapped with each other.

5. The thin-film transistor according to claim 1, wherein a thickness of the injection layer is no greater than 50 nanometers.

6. The thin-film transistor according to claim 1, wherein the control gate is above the base substrate, the floating gate is above the control gate, the active layer is above the floating gate, and the gate electrode is above the active layer.

7. The thin-film transistor according to claim 1, wherein the injection region and the oxidation region are in direct contact with each other in a direction perpendicular to the base substrate; and
an orthographic projection of the floating gate on the base substrate and an orthographic projection of the control gate on the base substrate are completely overlapped with each other.

8. A display substrate, comprising the thin-film transistor according to claim 1.

9. The display substrate according to claim 8, wherein the display substrate is an organic electroluminescent display panel;
the organic electroluminescent display panel comprises a driving transistor, a switching transistor and a control terminal;
the driving transistor and the switching transistor are each implemented as the thin-film transistor; and
a control gate of the driving transistor and a control gate of the switching transistor are electrically connected to the control terminal.

10. A display device, comprising: the thin-film transistor according to claim 1.

11. A manufacturing method of the thin-film transistor according to claim 1, comprising:
forming a pattern comprising the control gate, the floating gate, the injection layer, the active layer, the gate electrode, the source electrode and the drain electrode on the base substrate,
wherein the source electrode and the drain electrode are opposite to each other and respectively electrically connected to the active layer;
the injection layer is between the floating gate and the active layer;
the active layer is between the control gate and the gate electrode; and
the floating gate is between the control gate and the active layer.

12. The manufacturing method according to claim 11, wherein
a thickness of the injection layer is no greater than 50 nanometers;
the floating gate comprises an injection region and an oxidation region;
the injection region comprises a first terminal portion and a first extension portion, and the oxidation region comprises a second terminal portion and a second extension portion;
the second extension portion of the oxidation region is provided on a surface, which faces the active layer, of the first extension portion of the injection region, and a thickness of the second extension portion of the oxidation region is larger than a thickness of the first extension portion of the injection region;
an orthographic projection of the first terminal portion of the injection region on the base substrate and an orthographic projection of a region, which is electrically contacted with the drain electrode, of the active layer on the base substrate are overlapped with each other; and
an orthographic projection of the second terminal portion of the oxidation region on the base substrate and an orthographic projection of a region, which is electrically contacted with the source electrode, of the active layer on the base substrate are overlapped with each other.

13. The manufacturing method according to claim 12, wherein
forming of the pattern comprising the control gate, the floating gate, the injection layer, the active layer, the gate electrode, and the source electrode and the drain electrode on the base substrate comprises:
forming a pattern of the control gate on the base substrate;
forming a pattern of the floating gate on the base substrate formed with the pattern of the control gate, wherein the pattern of the control gate and the pattern of the floating gate are patterned by adopting an identical mask;
forming a pattern of the injection layer on the base substrate formed with the pattern of the floating gate;
forming a pattern of the active layer on the base substrate formed with the pattern of the injection layer;
forming a pattern of the gate electrode on the base substrate formed with the pattern of the active layer; and forming a pattern of the source electrode and the drain electrode on the base substrate formed with the pattern of the gate electrode.

14. The manufacturing method according to claim 13, wherein forming of the pattern of the floating gate comprises:
depositing a metal layer, and performing a patterning process to the metal layer, so as to form the pattern of the floating gate;
coating a photoresist on the pattern of the floating gate formed and performing exposure and development processes;
removing the photoresist corresponding to the oxidation region and reserving the photoresist corresponding to the injection region after the exposure and development processes are performed; and
performing an anodic oxidation process to a region, in which the photoresist is removed, of the floating gate, so as to form the oxidation region of the floating gate, and form the injection region of the floating gate in a region outside the oxidation region.

15. The manufacturing method according to claim 12, wherein
forming of the pattern comprising the control gate, the floating gate, the injection layer, the active layer, the gate electrode, and the source electrode and the drain electrode on the base substrate comprises:
forming a pattern of the gate electrode on the base substrate;
forming a pattern of the active layer on the base substrate formed with the pattern of the gate electrode;
forming a pattern of the injection layer on the base substrate formed with the pattern of the active layer;
forming a pattern of the floating gate on the base substrate formed with the pattern of the injection layer;
forming a pattern of the control gate on the base substrate formed with the pattern of the floating gate, wherein the pattern of the control gate and the pattern of the floating gate are patterned by adopting an identical mask; and
forming a pattern of the source electrode and the drain electrode on the base substrate.

16. The manufacturing method according to claim 12, further comprising:
converting at least a portion of the pattern of the active layer formed to a conductor.

17. The manufacturing method according to claim 12, further comprising:
forming a buffer layer between the control gate and the floating gate on the base substrate; and
forming a gate insulation layer between the active layer and the gate electrode on the base substrate.

18. A thin-film transistor, comprising:
a control gate, a floating gate, an injection layer, an active layer, a gate electrode, a source electrode and a drain electrode, which are provided on a base substrate, wherein
the source electrode and the drain electrode are opposite to each other and respectively electrically connected to the active layer;
the injection layer is between the floating gate and the active layer;
the active layer is between the control gate and the gate electrode; and
the floating gate is between the control gate and the active layer,
wherein the gate electrode is above the base substrate, the active layer is above the gate electrode, the floating gate is above the active layer, and the control gate is above the floating gate.

19. A thin-film transistor, comprising:
a control gate, a floating gate, an injection layer, an active layer, a gate electrode, a source electrode and a drain electrode, which are provided on a base substrate, wherein
the source electrode and the drain electrode are opposite to each other and respectively electrically connected to the active layer;
the injection layer is between the floating gate and the active layer;
the active layer is between the control gate and the gate electrode; and
the floating gate is between the control gate and the active layer,
a buffer layer between the control gate and the floating gate, and
a gate insulation layer between the active layer and the gate electrode.

* * * * *